(12) United States Patent
Gong et al.

(10) Patent No.: US 9,111,941 B2
(45) Date of Patent: Aug. 18, 2015

(54) NON-VOLATILE MEMORY DEVICE WITH TSI/TSV APPLICATION

(71) Applicant: GLOBALFOUNDRIES Singapore Pte. Ltd., Singapore (SG)

(72) Inventors: Shunqiang Gong, Singapore (SG); Juan Boon Tan, Singapore (SG); Lei Wang, Singapore (SG); Wei Liu, Singapore (SG); Wanbing Yi, Singapore (SG); Jens Oswald, Dresden (DE)

(73) Assignee: GLOBALFOUNDRIES SINGAPORE PTE. LTD., SINGAPORE (SG)

( * ) Notice: Subject to any disclaimer, the term of this patent is extended or adjusted under 35 U.S.C. 154(b) by 0 days.

(21) Appl. No.: 13/906,289

(22) Filed: May 30, 2013

(65) Prior Publication Data

US 2014/0264235 A1    Sep. 18, 2014

Related U.S. Application Data

(60) Provisional application No. 61/786,624, filed on Mar. 15, 2013.

(51) Int. Cl.
| | |
|---|---|
| *H01L 23/52* | (2006.01) |
| *H01L 29/40* | (2006.01) |
| *H01L 21/4763* | (2006.01) |
| *H01L 23/538* | (2006.01) |
| *H01L 27/22* | (2006.01) |
| *H01L 27/24* | (2006.01) |
| *H01L 23/498* | (2006.01) |

(52) U.S. Cl.
CPC ...... *H01L 23/5386* (2013.01); *H01L 23/49822* (2013.01); *H01L 23/49827* (2013.01); *H01L 23/5383* (2013.01); *H01L 27/222* (2013.01); *H01L 27/2463* (2013.01)

(58) Field of Classification Search
CPC ......... H01L 33/48; H01L 23/48; H01L 27/24; H01L 27/22; H01L 23/538; H01L 23/498; H05K 1/18; H05K 1/11
USPC .......... 257/621, 659, 774, 737, 772, E23.011, 257/E23.068, 4, 421; 361/808; 174/262; 438/382, 3; 365/51
See application file for complete search history.

(56) References Cited

U.S. PATENT DOCUMENTS

| | | | | |
|---|---|---|---|---|
| 2009/0121208 | A1* | 5/2009 | Nagashima et al. | 257/2 |
| 2010/0052132 | A1* | 3/2010 | Baek et al. | 257/686 |
| 2010/0270593 | A1* | 10/2010 | Lung et al. | 257/208 |
| 2010/0283026 | A1* | 11/2010 | Mikawa et al. | 257/2 |
| 2010/0314711 | A1* | 12/2010 | Farooq et al. | 257/506 |
| 2012/0074582 | A1* | 3/2012 | Yu et al. | 257/774 |
| 2012/0106117 | A1* | 5/2012 | Sundaram et al. | 361/808 |
| 2012/0147650 | A1* | 6/2012 | Samachisa et al. | 365/51 |
| 2012/0218808 | A1* | 8/2012 | Yasuda et al. | 365/148 |
| 2012/0326113 | A1* | 12/2012 | Yoneda et al. | 257/4 |
| 2013/0043584 | A1* | 2/2013 | Kwon et al. | 257/737 |

* cited by examiner

*Primary Examiner* — Chuong A Luu
*Assistant Examiner* — Moazzam Hossain
(74) *Attorney, Agent, or Firm* — Horizon IP Pte. Ltd.

(57) ABSTRACT

Memory devices and methods for forming the device are disclosed. The device includes a substrate having an array surface and a non-array surface and a memory array having a plurality of memory cells interconnected by first conductors in a first direction and second conductors in a second direction. The memory array is disposed on the array surface of the substrate. The device further includes through silicon via (TSV) contacts disposed in the substrate. The TSV contacts extend from the array surface to the non-array surface, enabling electrical connections to the array from the non-array surface.

20 Claims, 8 Drawing Sheets

NON-VOLATILE MEMORY DEVICE WITH TSI/TSV APPLICATION

BACKGROUND

A random access memory (RAM) device includes a memory array with numerous memory cells interconnected to store information. Control circuitry is provided to facilitate accessing the memory cells. For example, a non-volatile memory (NVM) array includes NVM memory cells and control circuitry for accessing the information stored. In the case of an NVM array, data is retained even when power is removed.

However, as the demand for larger capacity storage continues, devices become larger. For example, larger arrays with more memory cells along with more complex control circuitry require a larger chip area in order to accommodate the components. This results in higher costs. Additionally, conventional RAM devices with integrated control circuitry reduce flexibility since some types of memories, such as phase change RAMs (PCRAMs) or magnetic RAMs (MRAMs), require high thermal budget. This may create processing issues with the control circuitry.

From the foregoing discussion, it is desirable to provide improved memory devices.

SUMMARY

Embodiments generally relate to NVM devices. In one embodiment, the device includes a substrate having an array surface and a non-array surface and a memory array having a plurality of memory cells interconnected by first conductors in a first direction and second conductors in a second direction. The memory array is disposed on the array surface of the substrate. The device further includes through silicon via (TSV) contacts disposed in the substrate. The TSV contacts extend from the array surface to the non-array surface. The TSV contacts enable electrical connections to the array from the non-array surface.

In another embodiment, a method for forming a memory device is presented. The method includes providing a substrate having an array surface and a non-array surface. TSV contacts extending from the array surface to the non-array surface of the substrate are formed. A memory array having a plurality of memory cells interconnected by first and second conductors are formed. The memory array is coupled to the TSV contacts.

In yet another embodiment, a method for forming a NVM device is presented. The method includes providing a substrate having an array surface and a non-array surface. TSV contacts extending from the array surface to the non-array surface of the substrate are formed. A resistive type NVM having a plurality of memory cells interconnected by first and second conductors is formed. The resistive type NVM is coupled to the TSV contacts.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which.

DETAILED DESCRIPTION

Figure 1A:
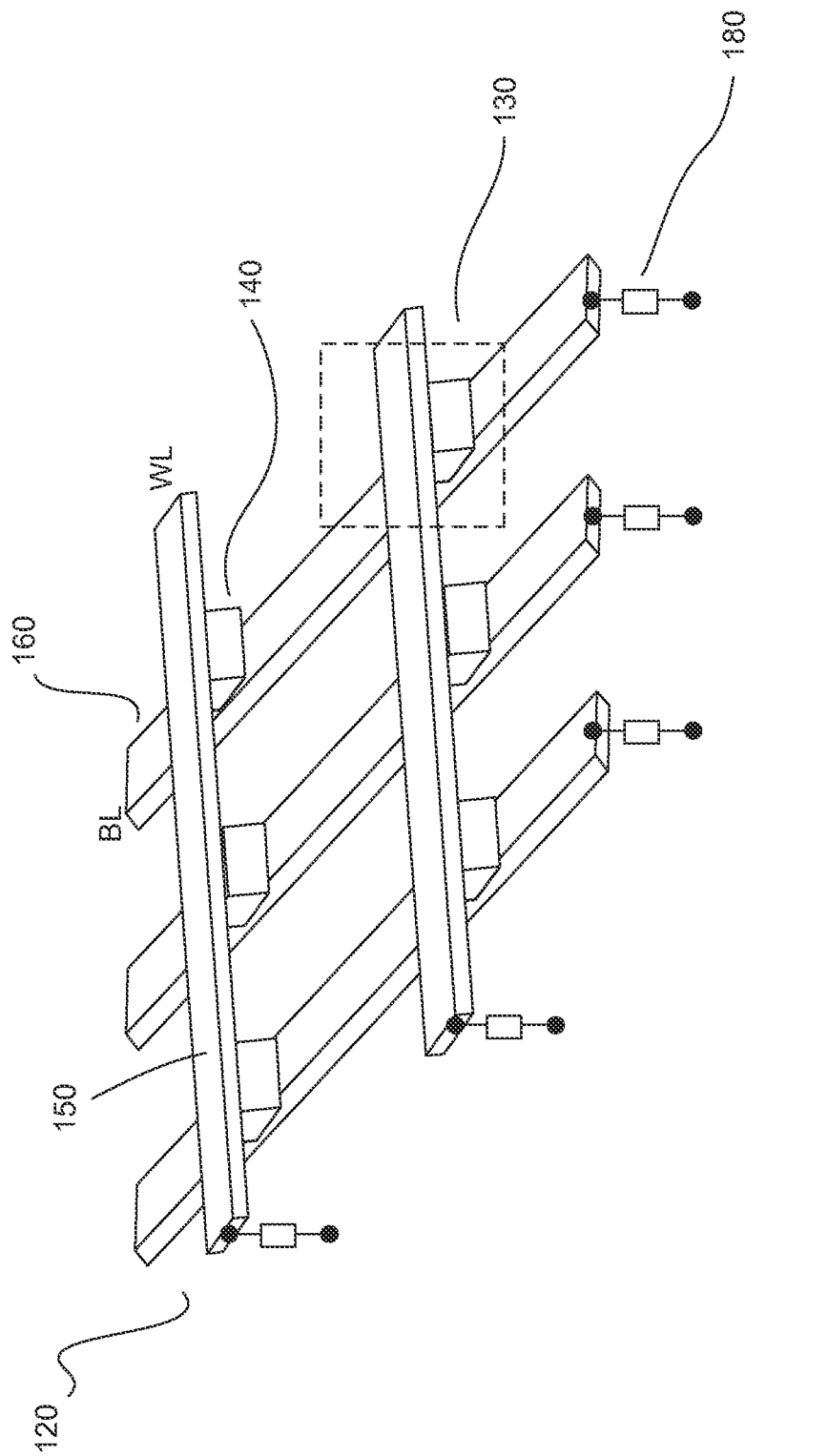
FIGS. 1a-d show simplified views of embodiments of a device.

Embodiments relate to NVM devices. NVM devices, for example, may include PCRAMs, MRAMs or resistive RAMs (ReRAMs). Other types of NVM or memory devices may also be useful. Such NVM devices may be incorporated into electronic products or equipment, such as phones, computers, mobile smart products, etc.

FIGS. 1a-d show simplified views of embodiments of a device 100. The device, as shown, includes a memory array 120 having a plurality of memory cells 130. In one embodiment, the memory array is a non-volatile memory (NVM) array with NVM cells. A memory cell includes a storage element 140 disposed between first and second conductors 150 and 160. The storage element, for example, may be a storage plug disposed between the first and second conductors. In one embodiment, the storage element is a resistive storage element, forming a resistive NVM cell.

The array includes a plurality of first conductors in a first direction (e.g., x direction) and a plurality of second conductors in a second direction (e.g., y direction). For example, first or upper conductors are disposed in a first direction while second or lower conductors are disposed in the second direction. In one embodiment, the upper conductors are wordlines (WLs) and the lower conductors are bitlines (BLs). The first and second directions, for example, are orthogonal directions. Other configurations of conductors may also be useful. Storage elements are disposed at the intersections of the upper and lower conductors, forming memory cells.

A resistive storage element is a programmable resistive element. The programmable resistive element has multiple stable resistive states. In one embodiment, the resistive element is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful.

In one embodiment, the storage element is a phase change (PC) storage element. The PC storage element includes a PC material (PCM), forming a PC random access memory (PCRAM) cell. Various types of PCMs may be used. For example, the PCM may be a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed.

The PCM may be in a crystalline or amorphous phase. The crystalline phase is a low resistance phase while the amorphous phase is a high resistance phase. The PCM, in either phase or state, is stable until reset or set. For example, the PCM may be reset to the amorphous phase from the crystalline phase by exposing it to a reset condition or set from the amorphous phase to the crystalline phase by exposing it to a set condition.

In one embodiment, the set condition includes heating the PCM at its amorphous phase to a crystallization temperature for a sufficient time to transform it to a crystalline phase. On the other hand, the reset condition includes heating to melt the crystalline PCM and rapidly cooling it so it becomes amorphous. Heating the PCM includes appropriately passing current to a heater or a heating element. In one embodiment, the storage plug includes a heating element along with the PCM.

Alternatively, the storage element may include a resistive material (RM) to form a resistive RAM (ReRAM) cell. The RM may be a material which can form filaments. For example, the RM may be a non-stoichiometric metal oxide layer, such as hafnium oxide ($HfO_2$) or tantalum oxide ($TaO_x$ or $Ta_2O_x$, where x is not an integer) layer. Other types of RMs may also be useful. A RM is subjected to a forming procedure which creates conduction paths of filaments. The filaments can be reset or broken by subjecting the RM to a reset procedure or condition; the filaments can be set or re-formed by subjecting the RM to a set procedure or condition. A reset RM with broken filaments results in a high resistive state (e.g., logic "0") while a set RM with formed or re-formed filaments results in a low resistive state (e.g., logic "1"). The RM storage plug may include upper and lower electrodes, such as platinum (Pt) or iridium (Ir) electrodes, sandwiching the RM. Generally, the set and reset currents for RM are in the opposite direction. For example, the RM uses bipolar currents for set and reset. Providing unipolar currents for set and reset may also be useful.

In yet other embodiments, the storage element may be a magnetic resistive (MR) storage plug to form a MRAM cell. For a MR storage plug, it includes a magnetic tunneling junction (MJT) stack between upper and lower electrodes, such as PtMn, IrMn, or Co/Pd. The MJT stack includes first and second magnetic or ferromagnetic (FM) layers separated by a tunneling layer. The first FM layer, for example, is a fixed or pinned layer having a fixed magnetization direction while the second FM layer is a free layer with a switchable magnetization direction. The fixed layer may be CoFeB, the tunneling layer may be MgO or $Al_2O_3$, and the free layer may be CoFeB/Ru/CoFeB. Other configurations of MJT stack may also be useful. The direction of the magnetization of the fixed and free layers may be aligned in a direction parallel or perpendicular to the MR stack.

The MR storage element has a high resistive state when the magnetization directions of the layers are in opposite directions and low resistive state when the magnetization directions of the layers are in the same direction. Switching of the magnetic field of the free layer may be achieved by applying a polarized current into the MR stack. For example, the polarized current may be applied to a writeline (WrL) 165 disposed below the BL, as shown in FIG. 1b and FIG. 1d. A WrL, for example, may include first and second WrLs disposed one over another. The first and second WrLs are used to set and reset the MRAM cell. For example, depending on the direction of the current, the magnetization direction of the free layer switches from one direction to the other. For example, bi-directional or bipolar currents are used to switch the magnetization direction of the free layer to the desired direction. As such, the set (e.g., low resistance phase) and reset (e.g., high resistance phase) currents are in the opposite direction.

The memory array is disposed on a substrate (not shown). The substrate, for example, may be a semiconductor substrate, such as a silicon wafer. Other types of substrates may also be useful. For example, the substrate may be a crystalline-on-insulator (COI) such as silicon-on-insulator, silicon germanium or other types of semiconductor substrates. The use of non-semiconductor substrates may also be useful. For example, in the case where the substrate serves as the interposer, the substrate need not be a semiconductor substrate. For example, the substrate may be formed of glass or other non-semiconductor material. Generally, the wafer is processed in parallel to form a plurality of devices. After processing is completed, the wafer is diced into individual devices.

The substrate, for example, includes first and second major surfaces. The memory array is disposed on one of the major surfaces. For example, the major surface on which the array is disposed on may be referred to as the array surface while the other surface may be referred to as the non-array surface. The array may be disposed within a dielectric layer on the array surface. The dielectric layer may be multiple dielectric layers corresponding to interlevel dielectric (ILD) layers, with metal levels. The metal levels correspond to the various conductors of the array. For example, metal levels are provided for BLs, WLs and, in some cases, for WrLs. The storage elements are disposed in a dielectric layer between BLs and WLs.

As described, the array does not include active components, such as memory control (e.g., peripheral or support) circuitry. For example, the array may be referred to as a passive array, while control circuitry, such as row decoders, column decoders, program circuitry, read circuitry or other types of circuitry, are not included.

In one embodiment, the array is connected to the non-array side of the substrate by through silicon via (TSV) contacts 180. For example, TSVs are used to couple the conductors of the array to the non-array side of the substrate. The TSV contacts are formed in through silicon vias (TSVs). The TSV contacts may be disposed in the periphery of the substrate. Locating the TSV contacts in other parts of the substrate which do not include components may also be useful. In one embodiment, the TSV contacts extend through the substrate surfaces. For example, the TSV contacts extend through the array and non-array surfaces of the substrate.

Figure 1B:
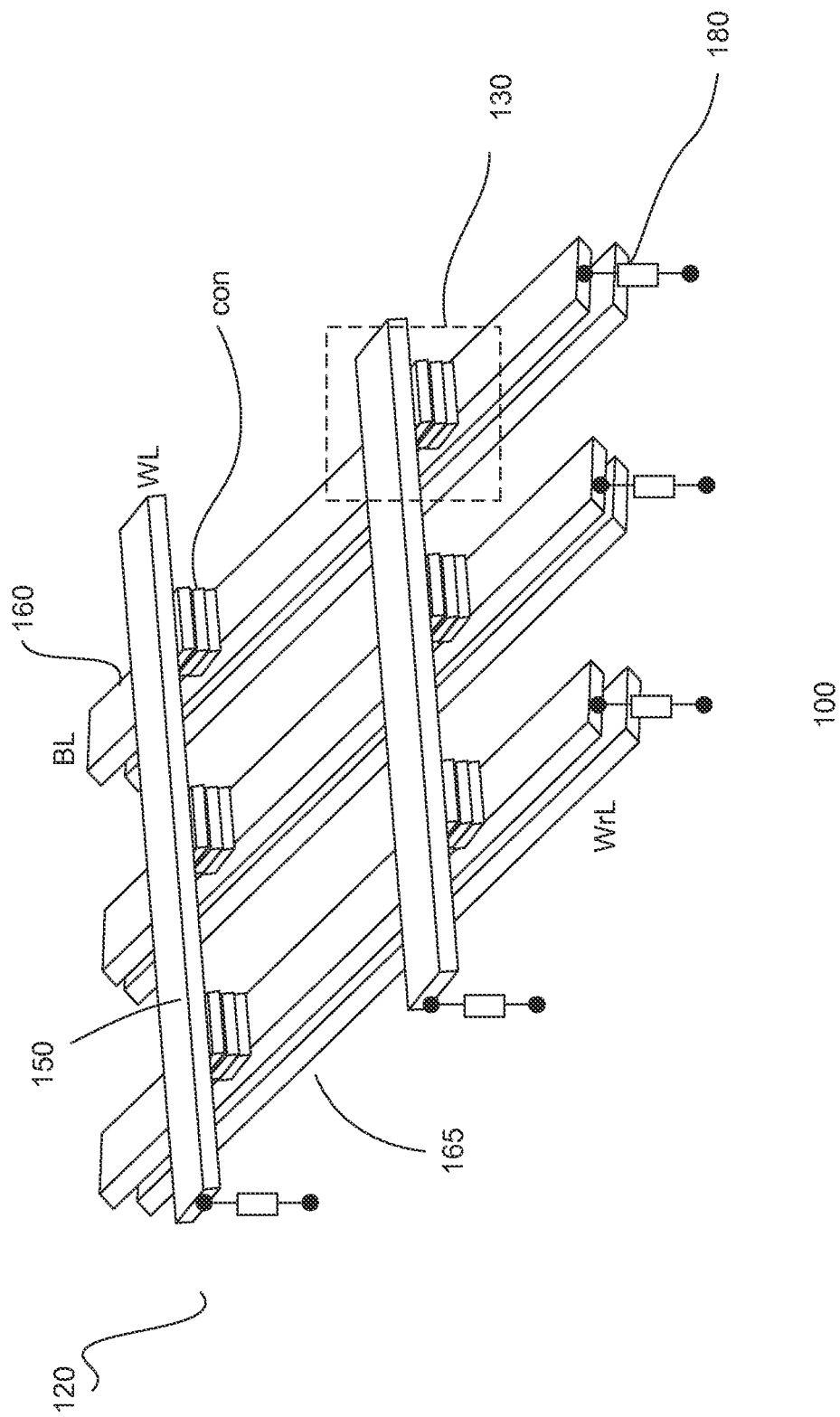

In one embodiment, the substrate serves as an interposer, as shown in FIGS. 1a-b. For example, the non-array surface includes contacts or contact bumps interconnected to the TSV contacts to provide connections to the memory array. The contact bumps may be connected to the TSV contacts through, for example, a redistribution layer (RDL). Other techniques for coupling the contact bumps to the TSV contacts may also be useful.

Figure 1C:
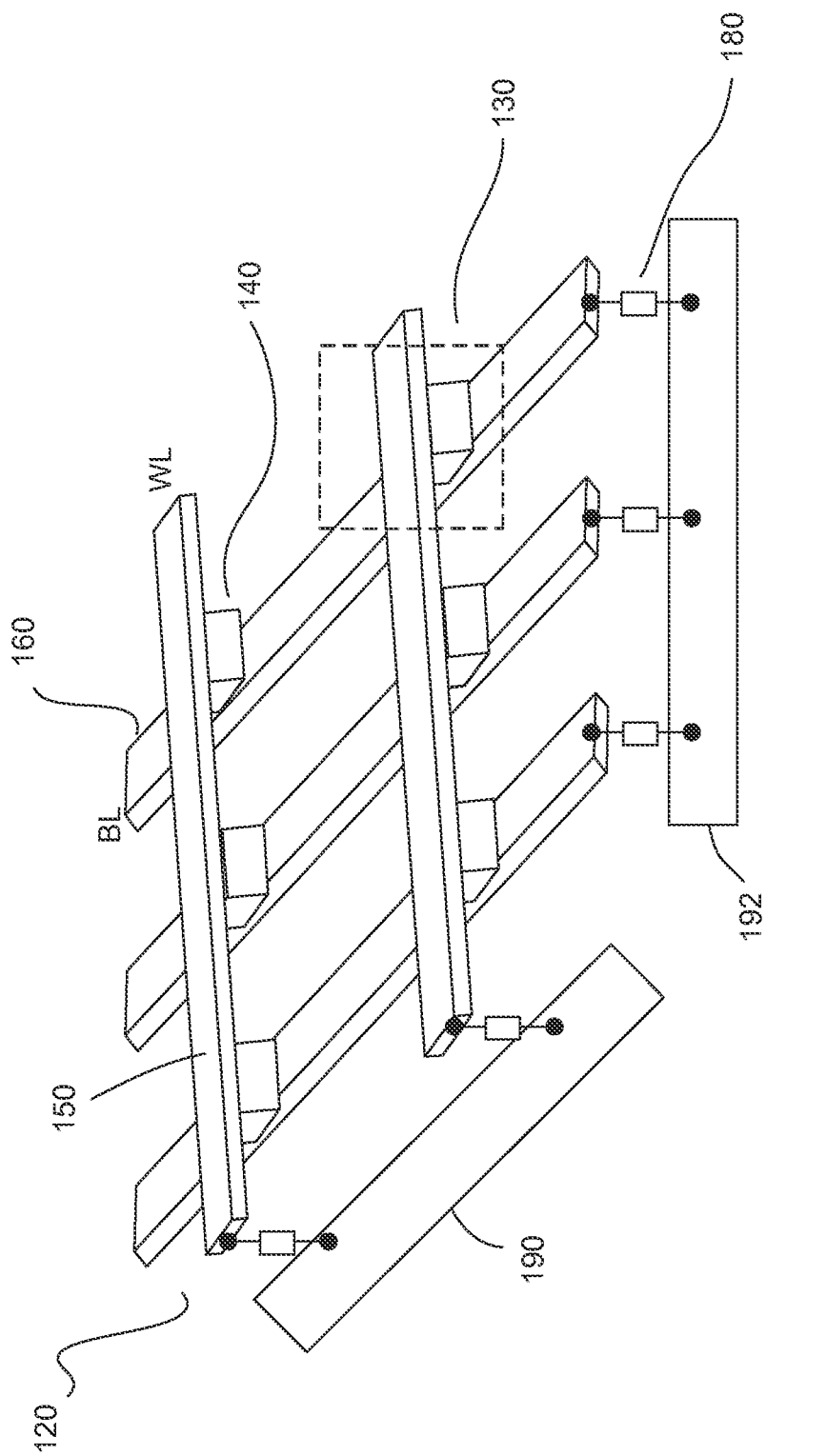
Figure 1D:
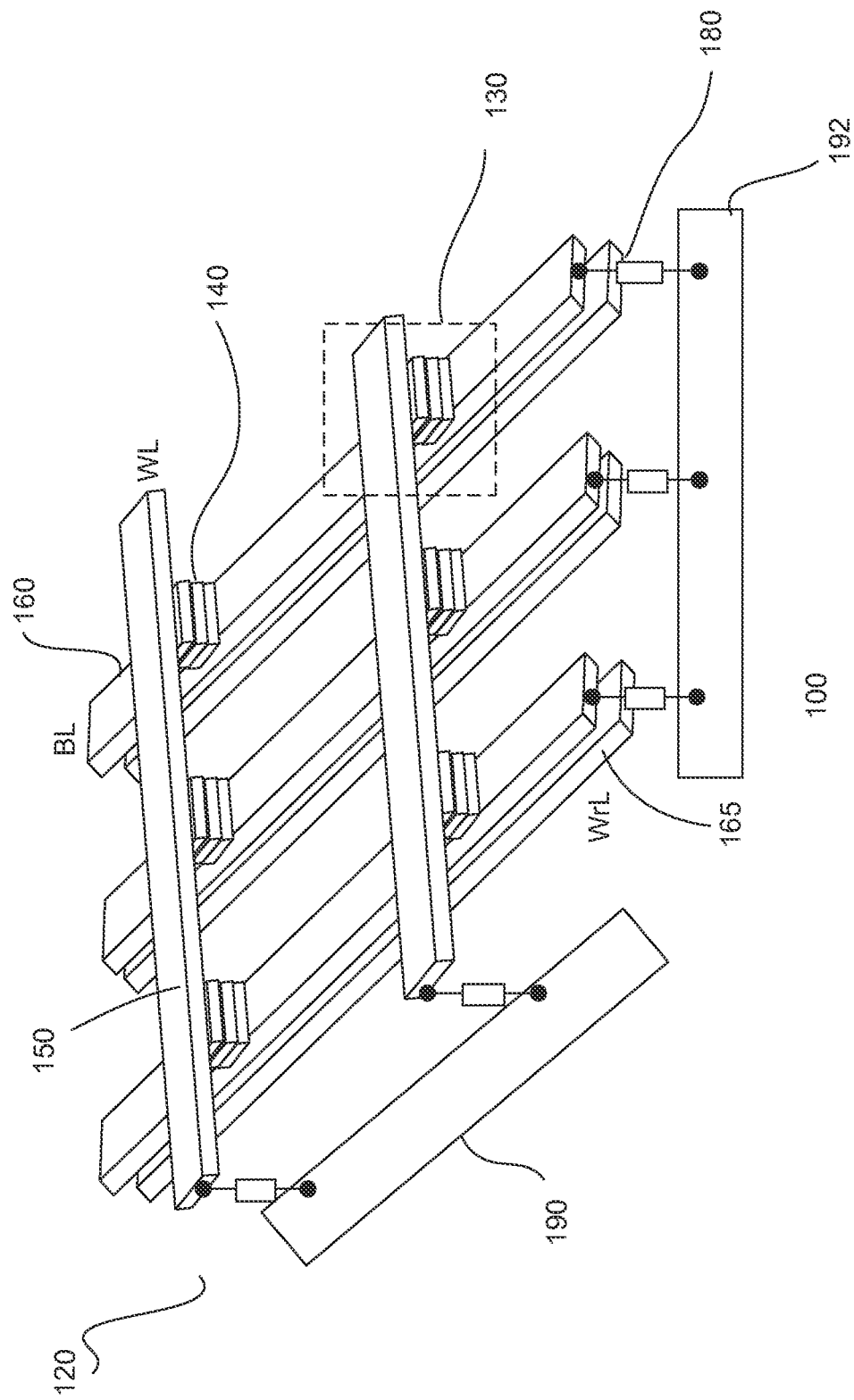

In other embodiment, as shown in FIGS. 1c-d, the TSV contacts are provided to connect to memory control circuitry disposed on the non-array side of the substrate. For example, as shown, TSV contacts 180 connect the array to row and column decoders 190 and 192. The TSV contacts 180 are also used to connect the array to other control circuitry. In such case, the non-array side may be referred to as the active side of the substrate while the array side may be referred to as the non-active side.

Figure 2:
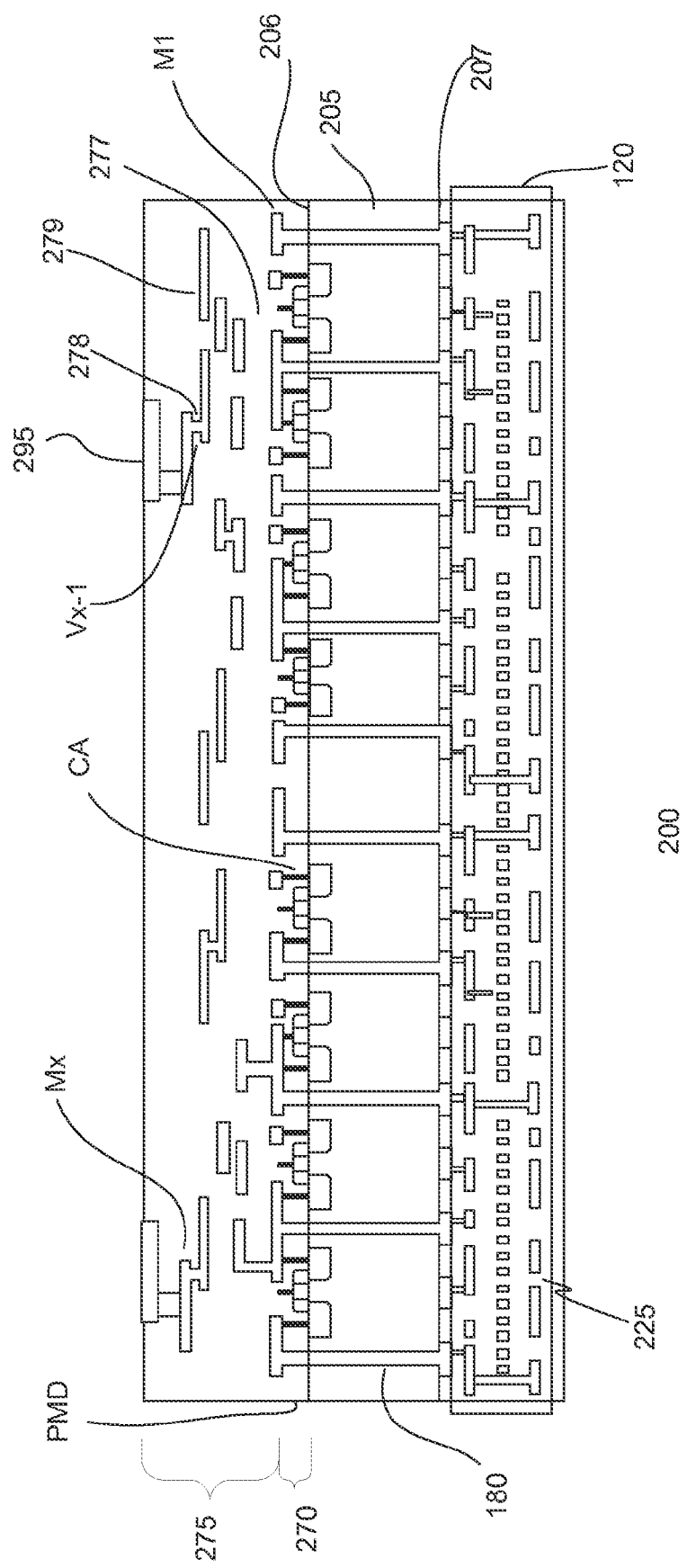
FIGS. 2-3 show cross-sectional views of embodiments of devices.

FIG. 2 shows a cross-sectional view of an exemplary embodiment of a device 200. The device may be similar to that described in FIGS. 1c-d. Common elements may not be described or described in detail. As shown, a substrate 205 is provided. In one embodiment, the substrate is a semiconductor substrate. For example, the substrate is a silicon wafer. Other types of substrates may also be useful. For example, the substrate may be a COI, silicon germanium or other types of semiconductor substrates.

The substrate includes first and second major surfaces 206 and 207. In one embodiment, the first surface is the active or top surface of the substrate while the second surface is the inactive or bottom surface of the substrate. A memory array 120 is disposed on the inactive surface of the substrate. The memory array may be a NVM memory array. The NVM memory array may be a resistive NVM memory array, such as a PCRAM, ReRAM or MRAM array. Providing other types of memory arrays may also be useful. The array may be disposed within a memory dielectric layer 225 on the array surface. The dielectric layer may include multiple dielectric layers corresponding to interlevel dielectric (ILD) layers, with metal levels. The metal levels correspond to the various conductors of the array. The storage elements are disposed in a dielectric layer, for example, between BLs and WLs.

In one embodiment, active components 277 for controlling accesses to the memory array are disposed on the active surface of the substrate. The active components, for example, may include row decoders, column decoders, program circuitry, read circuitry or other types of circuitry. The active components may be formed as part of the front end of line (FEOL) processing. A dielectric layer 270, such as a premetal dielectric (PMD) layer, is disposed on the substrate, covering the active components. A dielectric layer 275 may be disposed over the PMD layer. The dielectric layer may include a plurality of ILD layers. An ILD layer includes a metal level with metal lines 279 and a via level with via contacts 278. Via contacts may be employed to provide connection between metal lines of two different metal levels. Contacts CAs are provided in the PMD layer to interconnect the active components to metal lines in M1 level. As shown the dielectric layer includes metal levels M1 to Mx. The metal lines and contacts, for example, are formed using back end of line (BEOL) processing. For example, damascene techniques, including dual damascene techniques, may be used. Other techniques may also be used to form the metal lines and contacts. Pads 295 may be included. The pads provide external connections to the device. The pads may be coupled to Mx via pad contacts. Contact bumps (not shown) may be provided on the pads.

In one embodiment, TSV contacts 180 are provided through the surfaces of the substrate. The TSV contacts provide interconnections between the active components on the active side of the substrate to the memory array on the inactive side of the substrate. The device, as shown, includes memory array and control circuitry integrated on different sides of a substrate, which is a 3D application using TSV contacts.

To facilitate stacking of devices, the bottom or exposed surface of the memory dielectric layer containing the memory array may include contact bumps and an RDL layer. The contact bumps are coupled to the TSV contacts, providing interconnections to the active side of the substrate. In this way, devices can be stacked and interconnected.

Figure 3:
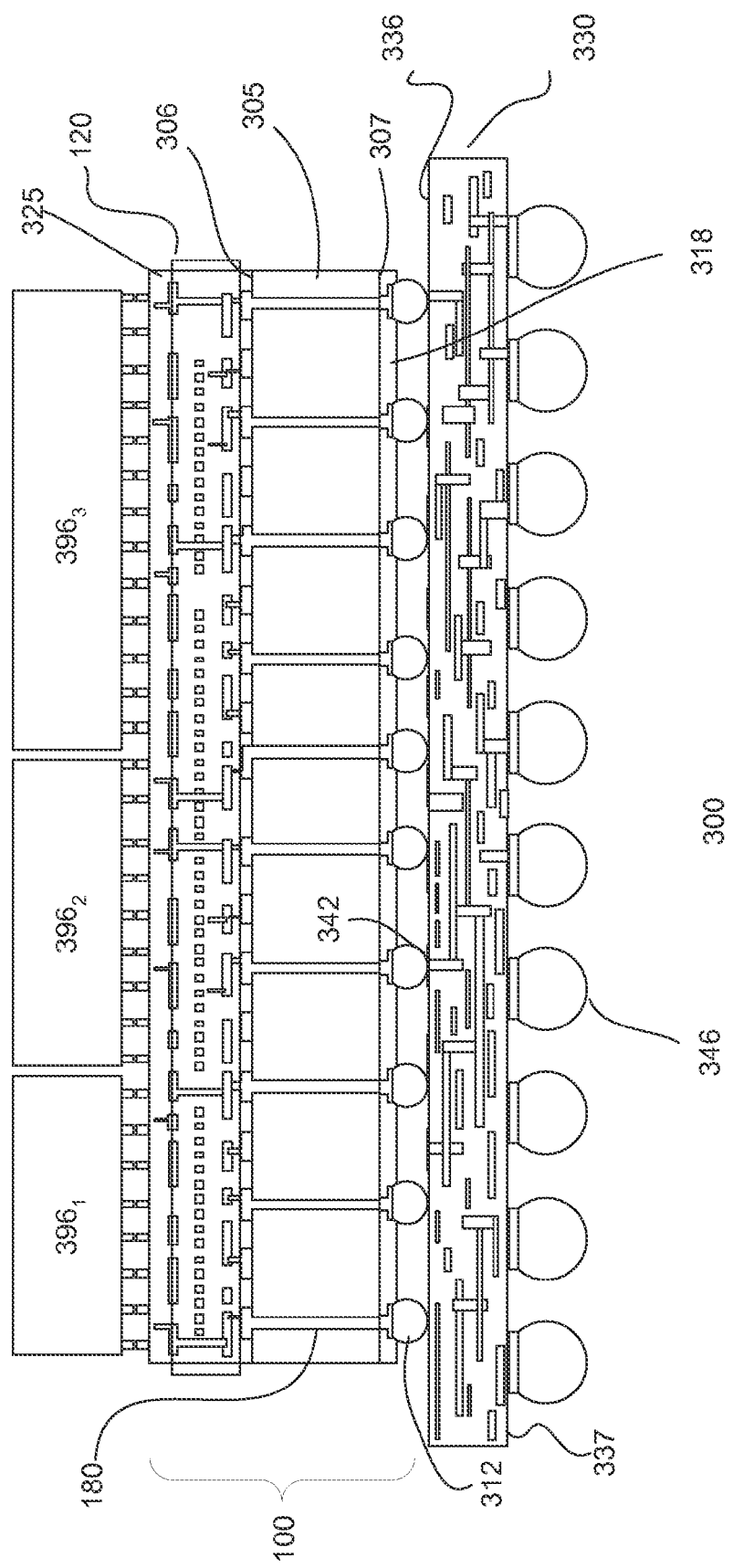

FIG. 3 shows a cross-sectional view of an exemplary embodiment of a device 300. As shown, the device may be a multi-chip system (MCS) device. As shown, the device includes an interposer device 100. The interposer device, for example, may be similar to that described in FIGS. 1a-b. Common elements may not be described or described in detail. The interposer device includes an interposer substrate 305. In one embodiment, the substrate is a semiconductor substrate. Non-semiconductor substrates, such as glass, may also be useful.

The substrate includes first and second major surfaces 306 and 307. In one embodiment, the first surface is an array surface and the second surface is a non-array surface. In the case of an interposer, both surfaces may be inactive surfaces. A memory array 120 is disposed on the array surface of the substrate. The memory array may be a NVM memory array. The NVM memory array may be any type of memory array. For example, the memory array may be an NVM array, such as a PCRAM, ReRAM or MRAM array. Other types of memory arrays may also be useful. The array may be disposed within a memory dielectric layer 325 on the array surface. The dielectric layer may include multiple dielectric layers corresponding to interlevel dielectric (ILD) layers, with metal levels. The metal levels correspond to the various conductors of the array. The storage elements are disposed in a dielectric layer, for example, between BLs and WLs.

In one embodiment, TSV contacts 180 are provided through the surfaces of the substrate. The TSV contacts provide interconnections from the non-array surface of the substrate to the memory array. The non-array surface includes interposer contacts 312 disposed thereon. The interposer contacts, for example, may be separated from the non-array substrate surface by a dielectric layer 318. The dielectric layer may include an RDL to interconnect the interposer contacts to the TSV contacts.

On the top surface of the memory dielectric layer, pads such as micro-pillar may be disposed to connect to top-dies. The pads provide connections to the array as well as to the TSV contacts on the interposer substrate. An RDL may be provided for facilitating connections between the TSVs and memory array to the contact bumps.

In one embodiment, the interposer device is coupled to a package substrate 330. The package substrate, for example, may be a polyimide substrate. Other types of package substrates may also be useful. The package substrate includes first and second major package surfaces 336 and 337. The first surface, for example, may be a top surface while the second surface may be a bottom surface of the package substrate. The top surface includes package pads 342 while the bottom surface includes package contacts 346. The package pads are coupled to the package contacts through internal metal traces and contacts in the package substrate. For example, the package substrate may include multiple layers containing the metal traces and contacts to form the desired connection between the package pads and package contacts.

In one embodiment, one or more control devices 396 may be stacked on top of the interposer device. For example, first memory controller 396$_1$, second memory controller 396$_2$ and a microcontroller (MCU) 396$_3$ are disposed on the memory dielectric layer of the interposer device. For example, the control devices are mated to the interposer pads on the memory dielectric layer. Providing other number or types of control devices may also be useful. As described, the control circuitry is in a separate device or separate devices. The MCS, as shown, is a 2.5D application. The MCS system may be mounted onto, for example, a circuit board though the package contacts. It should be understood that FIG. 3 is merely illustrative and is not meant to be limiting. For example, the interposer may include any number of chips or dies.

Figure 4:
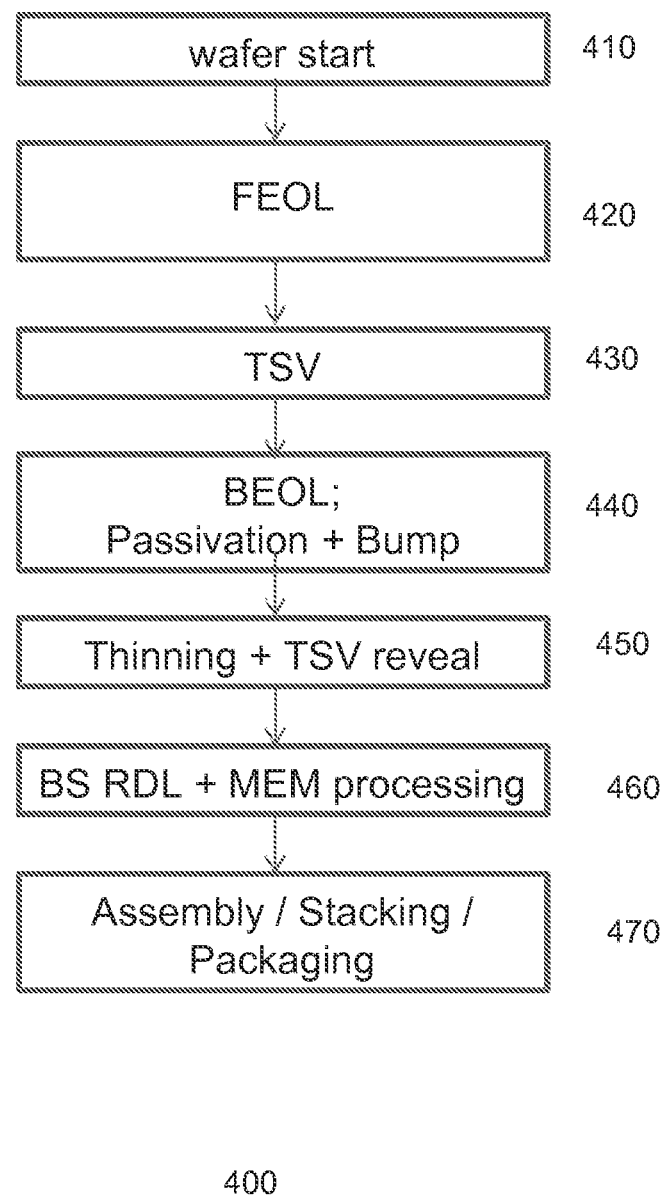
FIGS. 4-5 show embodiments of process flows for forming devices.

FIG. 4 shows an embodiment of a process flow 400 for forming a device, such as that described in FIGS. 1c-d and FIG. 2. Common elements may not be described or described in detail. At step 410, a wafer start is performed. The wafer is processed, for example, using FEOL processing at step 420. The FEOL processing, for example, forms memory control circuitry on an active side of the wafer. After FEOL processing, a TSV module is performed to form TSV contacts at step 430. Processing of the wafer continues with BEOL processing to form metal lines and vias in metal and via levels. This forms connections of the control circuitry to the TSV contacts. Passivation and pad opening processes may follow. For example, a passivation layer may be formed over the pads and openings are formed therein to expose the pads. This may complete processing of the active side of the wafer.

The process continues to process the backside or inactive side of the substrate. In one embodiment, the process proceeds by thinning the back side of the wafer to expose the bottom of the TSV contacts at step 450. At step 460, a backside RDL and memory array are formed, connecting the array to the TSVs. After forming the memory array, contact bumps may be formed. For example, memory bumps may be formed for applications which have dies that are stacked. After processing of the backside of the wafer is completed, the process may continue with assembly, stacking and packaging of the devices at step 470.

Figure 5:
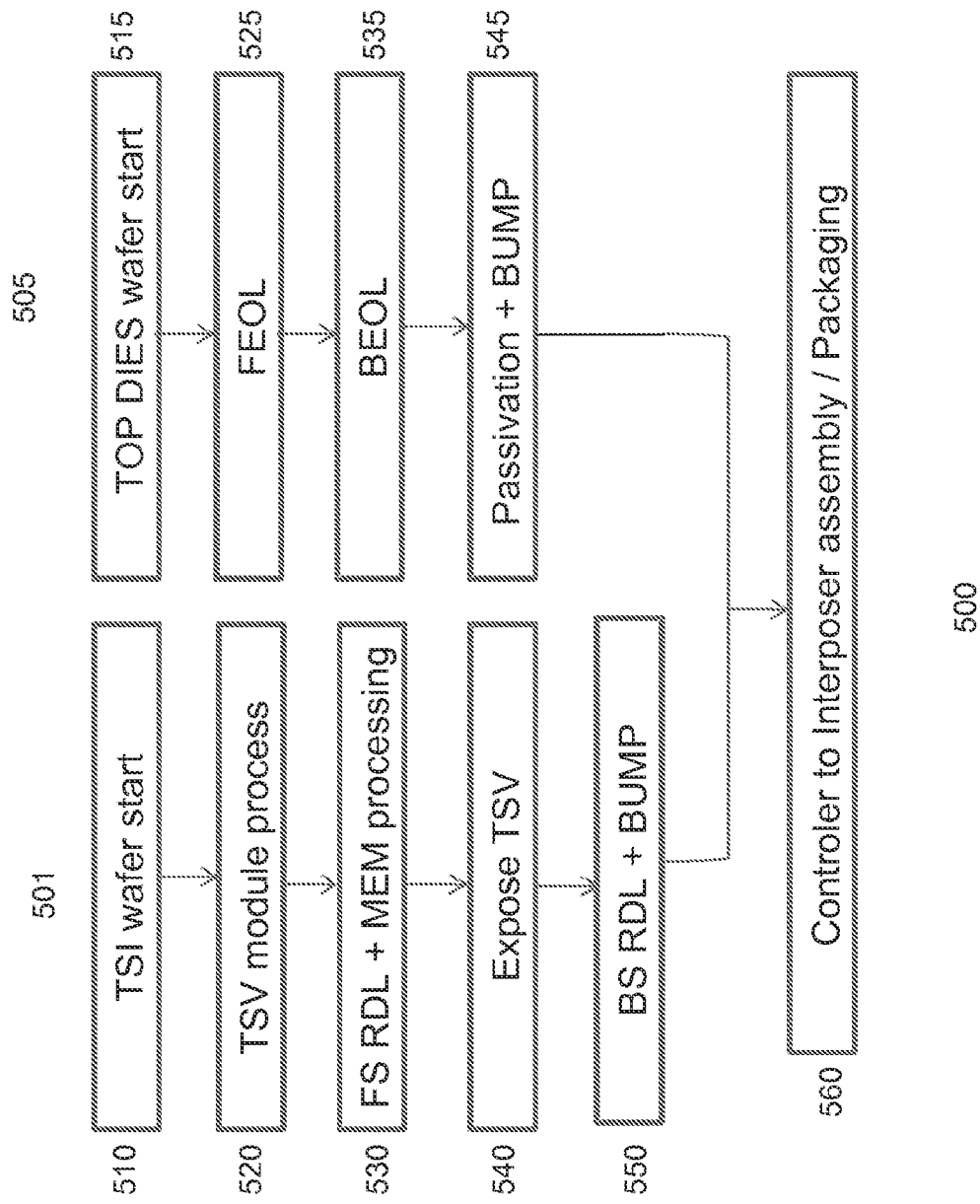

FIG. 5 shows another embodiment of a process flow 500 for forming a device, such as that described in FIGS. 1*a-b* and FIG. 3. The process may contain similar steps as that described in FIG. 4. Common elements may not be described or described in detail. As shown, the process includes two independent sub-process flows 501 and 505. As for the first sub-process flow, it is used to form a through silicon interposer (TSI) device with an integrated memory array. In one embodiment, at step 510, an interposer wafer start is performed. The process commences with executing a TSV module at step 520 to form TSV contacts in the TSI wafer. At step 530, an RDL and memory array may be formed. The RDL provides connections for the memory array to the TSVs from, for example, the front side of the TSI wafer.

The process continues to process the backside of the TSI wafer. In one embodiment, the process proceeds to expose the TSV contacts at step 540. For example, the process includes thinning/grinding the back side of the wafer to expose the bottom of the TSV contacts. At step 550, a backside RDL and interposer contact bumps may be formed. This, for example, completes processing of the TSI wafer.

As for the second sub-process flow, it forms a memory controller device. At step 515, a top-dies/controller wafer start is performed. The wafer is processed using FEOL processing at step 525. The FEOL processing, for example, forms memory control circuitry. After FEOL processing, BEOL processing commences at step 535 to form metal lines and vias in metal and via levels. This forms interconnections for the control circuitry. A passivation may be formed over the metal levels at step 545. Openings are formed in the passivation, followed by forming of contact bumps in the openings. The contact bumps provide external access to the control circuitry. This completes processing of the active side of the top-dies/controller wafer. The wafer is diced to separate the top-dies/controller devices into individual top-dies/controller devices.

At step 560, the top-dies/controller device is mounted to the TSI device to form the device such as that described in FIGS. 1*a-b* and FIG. 3. The TSI device with the top-dies/controller device may be mounted onto a package substrate. In some cases, more than one top-dies/controller device may be mounted onto the TSI device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
a semiconductor substrate having an array surface and a non-array surface;
a memory dielectric layer disposed on and contacts the array surface of the substrate;
a memory array having a plurality of memory cells interconnected by first conductors in a first direction and second conductors in a second direction, the memory array is disposed in the memory dielectric layer which is disposed on and contacts the array surface of the substrate;
through silicon via (TSV) contacts disposed in the substrate, the TSV contacts extend from the array surface to the non-array surface, the TSV contacts enable electrical connections to the array surface from the non-array surface; and
a dielectric layer disposed on and contacts the non-array surface of the substrate.

2. The device of claim 1 wherein:
the substrate serves as an interposer substrate; and comprising
interposer contacts which are separated by the dielectric layer from the non-array surface, the interposer contacts to enable electrical connection between the memory array by the TSV contacts; and
interposer pads disposed on the memory dielectric layer to electrically connect the memory array and other circuitry via TSV.

3. The device of claim 2 comprising at least one active component disposed on the memory dielectric layer, wherein the active component comprises a controller device that is connected to the interposer pads.

4. The device of claim 1 wherein the non-array surface of the substrate serves as an active surface of the substrate and the array surface of the substrate serves as an inactive surface of the substrate.

5. The device of claim 4 comprising active components for controlling access to the memory array, wherein the active components are disposed on the non-array surface of the substrate and the dielectric layer covers the active components.

6. The device of claim 1 comprising:
array contacts disposed on a surface of the memory dielectric layer disposed on the array surface, the array contacts are coupled to the TSV contacts to facilitate stacking of the device with another device; and
redistribution layer (RDL) disposed in the memory dielectric layer.

7. The device of claim 1 wherein the memory array is an NVM array.

8. The device of claim 7 wherein the NVM array is a resistive-type NVM array.

9. The device of claim 8 wherein the array is a PCRAM array or a MRAM array.

10. The device of claim 1 wherein a memory cell includes a storage plug disposed between first and second conductors.

11. A method for forming a device comprising:
providing a semiconductor substrate having an array surface and a non-array surface;
forming a dielectric layer on and contacts the non-array surface and forming a memory dielectric layer on and contacts the array surface;
forming TSV contacts extending from the array surface to the non-array surface of the substrate; and
forming a memory array having a plurality of memory cells interconnected by first and second conductors in the memory dielectric layer which is formed on and contacts the array surface, wherein the memory array is coupled to the TSV contacts.

12. The method of claim 11 comprising:
forming the TSV contacts prior to forming the memory array; and
forming interposer pads on the memory dielectric layer to electrically connect the memory array and other circuitry via the TSV contacts.

13. The method of claim 12 comprising forming interposer contacts on the non-array surface of the substrate, the interposer contacts are coupled to the TSV contacts.

14. The method of claim 13 wherein the interposer contacts are separated from the non-array surface of the substrate by the dielectric layer which is formed on and contacts the non-array surface.

15. The method of claim 14 comprising:
processing the memory array side of the substrate first; and
processing the non-memory-array side of the substrate after completing processing of the array side.

16. The method of claim 15 wherein processing the non-memory-array side comprises:
thinning the back side of the substrate to expose the TSV contacts;
forming package contacts coupled to the TSV contacts.

17. The method of claim 11 comprising:
forming at least one active component on the non-array surface of the substrate using FEOL processing, wherein the at least one active component comprises control circuitry
forming the TSV contacts after forming the control circuitry; and
interconnecting the TSV contacts to the control circuitry using BEOL processing, wherein the dielectric layer covers the at least one active component.

18. The method of claim 17 comprises:
processing the array surface of the substrate after processing the non-array surface of the substrate;
thinning the array surface to expose the TSV contacts; and
forming a redistribution layer (RDL) in the memory dielectric layer which is formed on and contacts the array surface, wherein the RDL and memory array are formed together in the memory dielectric layer and the memory array is interconnected to the TSV contacts.

19. The method of claim 18 wherein the memory array comprises a resistive-type NVM array.

20. A method for forming a NVM memory device comprising:
providing a semiconductor substrate having an array surface and a non-array surface;
forming a memory dielectric layer on and contacts the array surface and forming a dielectric layer on and contacts the non-array surface;
forming TSV contacts extending from the array surface to the non-array surface of the substrate;
forming at least one active component on the non-array surface, wherein the dielectric layer covers the at least one active component; and
forming a resistive type NVM having a plurality of memory cells interconnected by first and second conductors in the memory dielectric layer which is formed on and contacts the array surface of the substrate, wherein the resistive type NVM is coupled to the TSV contacts.

* * * * *